(12) United States Patent
Hua et al.

(10) Patent No.: US 12,512,792 B2
(45) Date of Patent: Dec. 30, 2025

(54) RADIO FREQUENCY AMPLIFIER

(71) Applicant: NXP USA, INC., Austin, TX (US)

(72) Inventors: Qi Hua, Wu Xi (CN); Qi Wu, Guiyang (CN); Tonghe Liu, Pudong New District (CN); Wenming Li, Chengdu (CN); Changyang Wang, Shanghai (CN)

(73) Assignee: NXP USA, Inc., Austin, TX (US)

( * ) Notice: Subject to any disclaimer, the term of this patent is extended or adjusted under 35 U.S.C. 154(b) by 665 days.

(21) Appl. No.: 17/929,527

(22) Filed: Sep. 2, 2022

(65) Prior Publication Data
US 2023/0050988 A1 Feb. 16, 2023

(30) Foreign Application Priority Data
Sep. 6, 2021 (CN) .......................... 202111038476.0

(51) Int. Cl.
| | | |
|---|---|---|
| H03F 1/02 | (2006.01) | |
| H01L 23/66 | (2006.01) | |
| H03F 1/07 | (2006.01) | |
| H03F 1/56 | (2006.01) | |
| H03F 3/195 | (2006.01) | |

(52) U.S. Cl.
CPC .......... *H03F 1/0288* (2013.01); *H01L 23/66* (2013.01); *H03F 1/07* (2013.01); *H03F 1/565* (2013.01); *H03F 3/195* (2013.01)

(58) Field of Classification Search
CPC ..................................... H03F 1/02; H03F 1/07
USPC .............................................. 330/124 R, 295
See application file for complete search history.

(56) References Cited

U.S. PATENT DOCUMENTS

| | | | |
|---|---|---|---|
| 7,078,976 B2 * | 7/2006 | Blednov | ................. H01L 24/49 |
| | | | 330/53 |
| 8,228,123 B2 | 7/2012 | Blednov | |
| 8,487,703 B2 | 7/2013 | Blednov | |
| 9,543,914 B2 | 1/2017 | Bouny | |
| 2018/0175799 A1 | 6/2018 | Wu et al. | |
| 2020/0186107 A1 | 6/2020 | Fu et al. | |

OTHER PUBLICATIONS

NXP Semiconductor Datasheet; "RF Power GaN Transistor; Document No. A3G35H100-04S"; Revision 0, May 2018.

(Continued)

*Primary Examiner* — Henry Choe

(57) ABSTRACT

A radio frequency amplifier includes a first input terminal, a second input terminal, an output terminal, and first and second amplifiers. The first amplifier includes a first amplifier input coupled to the first input terminal, and a first amplifier output. The second amplifier includes a second amplifier input coupled to the second input terminal, and a second amplifier output coupled to the output terminal by an output inductive element. An output combiner circuit is coupled between the first amplifier output and the second amplifier output. The output combiner circuit includes a first inductive element, a capacitor, and a second inductive element. The first inductive element is coupled between the first amplifier output and a first terminal of the capacitor, and the second inductive element is coupled between the second amplifier output and the first terminal of the capacitor. A second terminal of the capacitor is coupled to ground.

20 Claims, 9 Drawing Sheets

(56) References Cited

OTHER PUBLICATIONS

Maroldt, Stephan et al.; "3.5-GHz Ultra-Compact GaN Class-E Integrated Doherty MMIC PA for 5G massive-MIMO Base Station Applications"; Proceeding of 12th European Microwave Integrated Circuits Conference; Oct. 9-10, 2017, Nuremberg, Germany.

* cited by examiner

RADIO FREQUENCY AMPLIFIER

CROSS-REFERENCE TO RELATED APPLICATION

This application claims priority under 35 U.S.C. 119 to Chinese patent application number 202111038476.0, filed on Sep. 6, 2021, the contents of which are incorporated by reference herein.

BACKGROUND

The present application is generally directed to amplifiers, and more particularly to radio frequency (RF) amplifiers and packaged amplifier devices used in the RF amplifiers.

In general, amplifiers are used to increase the power of signals. For example, amplifiers may be implemented as part of overall power amplifier used by an RF transmission system. Nowadays, massive multiple-input and multiple-output (MIMO) technology is an important component and used in 5G communication, which requires multiple channels of high efficiency power amplifiers (PAs) in one 5G base station. Either 32T (32 channels) or 64T (64 channels) is the common requirement, and therefore it brings many challenges especially on cost and printed circuit board (PCB) size for the amplifiers. There are many PA solutions such as discrete parts, PA modules and integrated Doherty Integrated Circuits (ICs) developed for these applications, but each of these existing solutions has some problems or disadvantages.

Therefore, there remains a need for an amplifier which may have the advantages of size reduction, cost savings, and design friendliness.

SUMMARY

This summary is provided to introduce a selection of concepts in a simplified form that are further described below in the Detailed Description. This summary is not intended to be relied on to identify important features or essential features of the claimed subject matter, nor is it intended to be used to limit the scope of the claimed subject matter.

According to a first aspect, there is a radio frequency (RF) amplifier comprising:
 a first input terminal;
 a second input terminal;
 an output terminal;
 a first amplifier including a first amplifier input coupled to the first input terminal, and a first amplifier output;
 a second amplifier including a second amplifier input coupled to the second input terminal, and a second amplifier output coupled to the output terminal;
 an output combiner circuit coupled between the first amplifier output and the second amplifier output, wherein the output combiner circuit comprises a first inductive element, a capacitor and a second inductive element, wherein the first inductive element is coupled between the first amplifier output and a first terminal of the capacitor, and the second inductive element is coupled between the second amplifier output and the first terminal of the capacitor, a second terminal of the capacitor is coupled to ground.

In some embodiments, the first inductive element comprises a set of bond wires coupled between the first amplifier output and the first terminal of the capacitor, and the second inductive element comprise another set of bond wires coupled between the second amplifier output and the first terminal of the capacitor.

In some embodiments, the RF amplifier further comprising an additional set of bond wires, wherein the additional set of bond wires is coupled between the output of the second amplifier and the output terminal of the radio frequency amplifier.

In some embodiments, the first amplifier comprises an input impedance matching network and a power transistor, wherein the input impedance matching network is configured to match the impedance between the input of first amplifier and the power transistor.

In some embodiments, the power transistor is a field effect transistor with a gate terminal coupled to the input impedance matching network, a drain terminal coupled to the first inductive element and a source terminal coupled to ground.

In some embodiments, the output combiner circuit provides a 90 degree phase shift to the signal amplified by the first amplifier so that the signals amplified by the first amplifier and the second amplifier combine in phase at the output of the second amplifier.

In some embodiments, the output combiner circuit provides a phase shift other than 90 degree to the signal amplified by the first amplifier so that the signals amplified by the first amplifier and the second amplifier combine in phase at the second amplifier output.

According to a second aspect, there is a radio frequency (RF) amplifier comprising:
 a semiconductor package including an output lead and a first input lead, a second input lead, the semiconductor package encasing:
 a first amplifier with a first transistor, wherein the first transistor includes a first transistor input coupled to the first input lead, and a first transistor output;
 a second amplifier with a second transistor, wherein the first transistor includes a second transistor input coupled to the second input lead, and a second transistor output coupled to the output lead;
 a first inductive element and a second inductive element, wherein the first inductive element is coupled between the first transistor output and a first terminal of a capacitor, and the second inductive element is coupled between the second transistor output and the first terminal of the capacitor, a second terminal of the capacitor is coupled to ground.

In some embodiments, the semiconductor package further comprises an integrated passive device (IPD), wherein the capacitor is formed with the IPD.

In some embodiments, the capacitor is a surface mount capacitor outside of the semiconductor package.

In some embodiments, the RF amplifier further comprises an additional microstrip line outside of the semiconductor package coupled between the first inductive element and the second inductive element, wherein the additional microstrip line coupled to the capacitor.

In some embodiments, the RF amplifier further comprises a shunt microstrip line outside of the semiconductor package coupled between the additional microstrip line and the capacitor.

In some embodiments, the RF amplifier comprises an additional set of bond wires, wherein the additional set of bond wires is coupled between the second transistor output and the output lead.

In some embodiments, the first inductive element, the second inductive element and the capacitor together provide a 90 degree phase shift to the signal amplified by the first amplifier so that the signals amplified by the first amplifier and the second amplifier combine in phase at the second transistor output.

In some embodiments, the first inductive element, the second inductive element and the capacitor together provide a phase shift other than 90 degree to the signal amplified by the first amplifier so that the signals amplified by the first amplifier and the second amplifier combine in phase at the second transistor output.

According to a third aspect, there is provided a packaged amplifier device comprising:
a first input lead and a second input lead;
an output lead;
a first amplifier with a first transistor, wherein the first transistor includes a first transistor input coupled to the first input lead, and a first transistor output;
a second amplifier with a second transistor, wherein the second transistor includes a second transistor input coupled to the second input lead, and a second transistor output coupled to the output lead;
a first inductive element and a second inductive element, wherein the first inductive element is coupled between the first transistor output and a first terminal of a capacitor, and the second inductive element is coupled between the second transistor output and the first terminal of the capacitor, a second terminal of the capacitor is coupled to ground.

In some embodiments, the semiconductor package further comprises an integrated passive device (IPD), wherein the capacitor is formed with the IPD.

In some embodiments, the capacitor is a surface mount capacitor outside of the semiconductor package.

In some embodiments, the first inductive element, the second inductive element and the capacitor together provide a 90 degree phase shift to the signal amplified by the first amplifier so that the signals amplified by the first amplifier and the second amplifier combine in phase at the second transistor output.

In some embodiments, the first inductive element, the second inductive element and the capacitor together provide a phase shift other than 90 degree to the signal amplified by the first amplifier so that the signals amplified by the first amplifier and the second amplifier combine in phase at the second transistor output.

BRIEF DESCRIPTION OF THE DRAWINGS

So that the manner in which the above recited features of the present application can be understood in detail, a more particular description of the application, briefly summarized above, may be had by reference to embodiments, some of which are illustrated in the appended drawings. It is to be noted, however, that the appended drawings illustrate only typical embodiments of this application and are therefore not to be considered limiting of its scope, for the application may admit to other equally effective embodiments. The drawings are for facilitating an understanding of the application and thus are not necessarily drawn to scale. Advantages of the subject matter claimed will become apparent to those skilled in the art upon reading this description in conjunction with the accompanying drawings, in which like reference numerals have been used to designate like elements, and in which:

DETAILED DESCRIPTION

Figure 1:
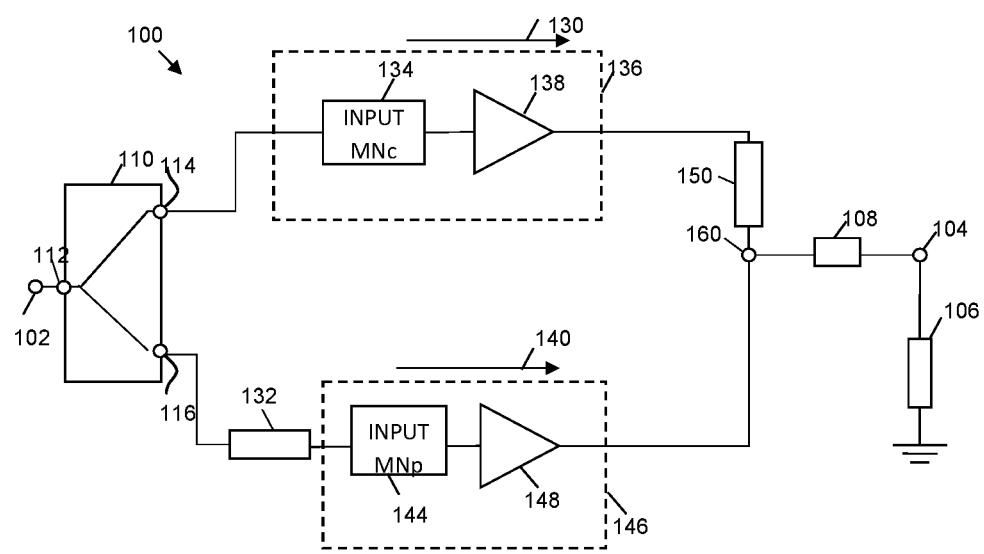
FIG. 1 illustrates a simplified schematic diagram of a conventional RF amplifier.

FIG. 1 is a simplified schematic diagram of a conventional Doherty amplifier 100. Amplifier 100 includes a single input terminal 102, an output terminal 104, a power splitter 110, a first amplifier path 130, a second amplifier path 140, and a combining terminal 160. A load 106 (e.g., an antenna) may be coupled to the combining terminal 160 through an impedance transformer 108, in an embodiment. The impedance transformer 108 may impart a 90 degree phase delay to the output RF signal before it is supplied to the load 106.

Power splitter 110 is configured to divide the input power of an input signal at the input terminal 102 received at power splitter input 112 into carrier and peaking portions of the input signal. The carrier input signal is provided to the first amplifier path 130 at power splitter output 114, and the peaking input signal is provided to the second amplifier path 140 at power splitter output 116. During operation in a full-power mode when both the carrier and second amplifiers 136, 146 are supplying current to the load 106, the power splitter 110 divides the input signal power between the amplifier paths 130, 140. For example, the power splitter 110 may divide the power equally, such that roughly one half of the input signal power is provided to each path 130, 140 (e.g., for a symmetric Doherty amplifier configuration). Alternatively, the power splitter 110 may divide the power unequally (e.g., for an asymmetric Doherty amplifier configuration).

Essentially, the power splitter 110 divides an input RF signal supplied at the input terminal 102, and the divided signals are separately amplified along the carrier and second amplifier paths 130, 140. The amplified signals are then combined in phase at the combining terminal 160. It is important that phase coherency between the carrier and second amplifier paths 130, 140 is maintained across a frequency band of interest to ensure that the amplified carrier and peaking signals arrive in phase at the combining terminal 160, and thus to ensure proper Doherty amplifier operation.

Each of the first amplifier 136 and the second amplifier 146 includes one or more single stage or multiple-stage power transistor integrated circuits (ICs) 138, 148 for amplifying an RF signal conducted through the first and second amplifiers 136, 146. These power transistor ICs may be implemented, for example, using silicon-based field effect transistors (FETs) (e.g., laterally diffused metal oxide semiconductor FETs, or LDMOS FETs), gallium nitride (GaN)-based FETs (e.g., high electron mobility transistors), or other types of power transistors. Although the carrier and peaking power transistor ICs may be of equal size (e.g., in a symmetric Doherty configuration), the carrier and peaking power transistor ICs may have unequal sizes, as well (e.g., in various asymmetric Doherty configurations). In an asymmetric Doherty configuration, the peaking power transistor IC(s) typically are larger than the carrier power transistor IC(s) by some multiplier. For example, the peaking power transistor IC(s) may be twice the size of the carrier power transistor IC(s) so that the peaking power transistor IC(s) have twice the current carrying capability of the carrier power transistor IC(s). Peaking-to-first amplifier IC size ratios other than a 2:1 ratio may be implemented, as well.

During operation of Doherty amplifier 100, first amplifier 136 is biased to operate in class AB mode, and second amplifier 146 is biased to operate in class C mode. More specifically, the transistor arrangement of first amplifier 136 is biased to provide a conduction angle between 180 and 360 degrees. Conversely, the transistor arrangement of the second amplifier 146 is biased to provide a conduction angle less than 180 degrees.

At low power levels, where the power of the input signal at terminal 102 is lower than the turn-on threshold level of second amplifier 146, the amplifier 100 operates in a low-power (or back-off) mode in which the first amplifier 136 is the only amplifier supplying current to the load 106. When the power of the input signal exceeds a threshold level of the second amplifier 146, the amplifier 100 operates in a high-power mode in which the first amplifier 136 and the second amplifier 146 both supply current to the load 106. At this point, the second amplifier 146 provides active load modulation at combining terminal 160, allowing the current of the first amplifier 136 to continue to increase linearly.

Input impedance matching network 134 (input MNc) may be implemented at the input of the first amplifier 136. Similarly, input impedance matching network 144 (input MNp) may be implemented at the input of the second amplifier 146. In each case, the matching networks 134, 144 may be used to incrementally increase the circuit impedance toward the load impedance. In addition, the first amplifier 136 and the second amplifier 146 may have additional pre-matching input and/or output impedance matching networks (not illustrated) that are either integrated with the power transistor dies, or integrated within the power transistor die packages.

Doherty amplifier 100 has a "non-inverted" load network configuration. In the non-inverted configuration, the input circuit is configured so that an input signal supplied to the second amplifier 146 is delayed by 90 degrees with respect to the input signal supplied to the first amplifier 136 at the center frequency of operation, $f_o$, of the amplifier 100. To ensure that the carrier and peaking input RF signals arrive at the carrier and second amplifiers 136, 146 with about 90 degrees of phase difference, as is fundamental to proper Doherty amplifier operation, a phase delay element 132 is provided, in the input path to the second amplifier 146, which applies about 90 degrees of phase delay to the peaking input signal. For example, phase delay element 132 may be a quarter wave transmission line, or another suitable type of delay element with an electrical length of about 90 degrees.

To compensate for the resulting 90 degree phase delay difference between the carrier and second amplifier paths 130, 140 at the inputs of first and second amplifiers 136, 146 (i.e., to ensure that the amplified signals arrive in phase at the combining terminal 160), the output circuit is configured to apply about a 90 degree phase delay to the signal between the output of first amplifier 136 and the combining terminal 160. This is achieved through an additional delay element 150. Alternate embodiments of Doherty amplifiers may have an "inverted" load network configuration. In such a configuration, the input circuit is configured so that an input signal supplied to the first amplifier 136 is delayed by 90 degrees with respect to the input signal supplied to the second amplifier 146 at the center frequency of operation, $f_o$, of the amplifier 100, and the output circuit is configured to apply about a 90 degree phase delay to the signal between the output of second amplifier 146 and the combining terminal 160.

Figure 2:
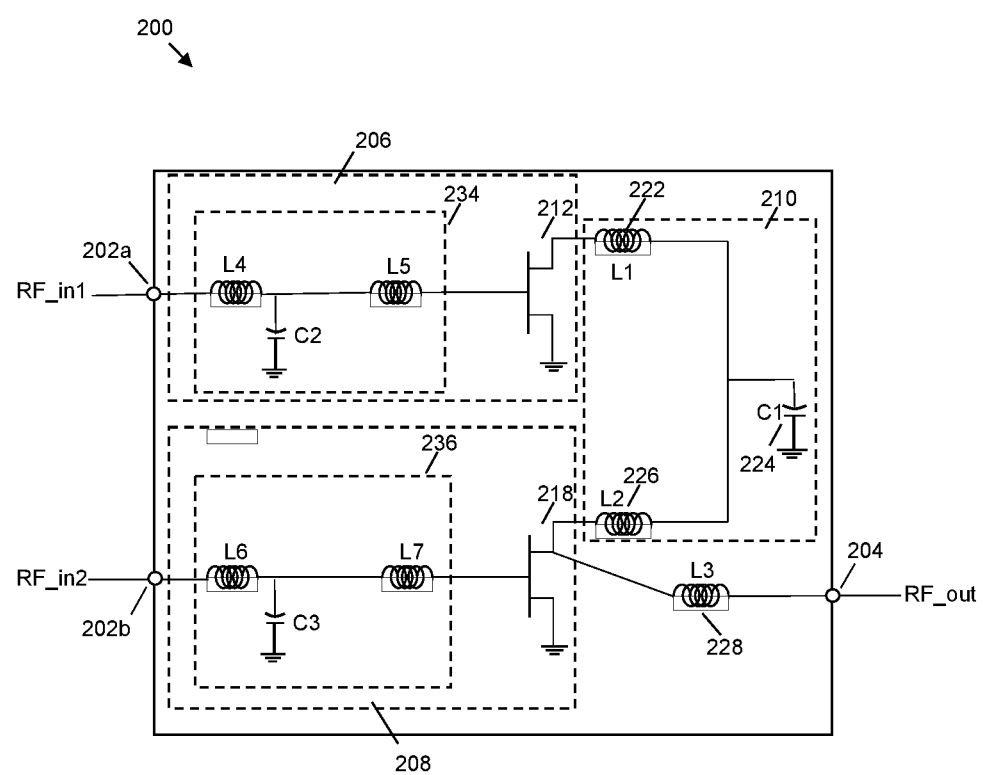
FIG. 2 illustrates a simplified schematic diagram of a RF amplifier in accordance with an embodiment.

FIG. 2 is a simplified schematic diagram of a Doherty amplifier 200 in accordance with an embodiment. In contrast to the conventional amplifier 100 described above, Amplifier 200 includes two separate input terminals (202a, 202b), an output terminal 204, a first amplifier 206, a second amplifier 208, and an output combiner circuit 210.

A first signal (carrier signal) received at the first input terminal 202a is amplified by the first amplifier 206. A second signal (peaking signal) received at the second input terminal 202b is amplified by the second amplifier 208.

The first amplifier 206 includes a first transistor (carrier transistor) 212, which may comprise a control terminal coupled to the input terminal 202a, a source terminal coupled to ground, and a drain terminal as the first amplifier output.

The second amplifier 208 includes a second transistor (peaking transistor) 218, which may comprise a control terminal coupled to the second input terminal 202b, a source terminal coupled to ground, and a drain terminal as the second amplifier output coupled to the output terminal 204.

The output combiner circuit 210 is coupled between the first amplifier output and the second amplifier output. The output combiner circuit 210 may comprise a first inductive element (L1) 222, a capacitor (C1) 224 and a second inductive element (L2) 226. The first inductive element 222 may be coupled between the first amplifier output and a first terminal of the capacitor 224. The second inductive element 226 may be coupled between the second amplifier output and the first terminal of the capacitor 224. A second terminal of the capacitor 224 may be coupled to ground.

In one embodiment, the first inductive element 222 may comprise a set of bond wires coupled between the first amplifier output and the first terminal of the capacitor 224, and the second inductive element 226 may comprise another set of bond wires coupled between the second amplifier output and the first terminal of the capacitor 224. The second terminal of the capacitor 224 is grounded.

As shown in FIG. 2, the output combiner circuit 210 in FIG. 2 comprises first inductive element (L1), second inductive element (L2), capacitor (C1) and the drain output parasitic capacitors of the carrier and peaking transistors (Cds_c and Cds_p). By selecting proper values of L1, L2 and C1, these components could serve as a quasi quarter-wave transmission line (TL), to provide a 90° phase shift or a phase shift other than 90 degree (e.g. within a range from 95° to 105°) for the output of the first or carrier amplifier.

To form the quasi quarter-wave TL, the five elements (Cds_c, Cds_p, L1, L2, and C1) should obey some relationship. Given that the Cds of the carrier and peaking transistors are known, the value of L2 and C1, and the characteristic impedance of the quasi TL (Z) could be obtained by the below equations (there are two alternative solutions for L2, C1 and Z: equations (1)-(3) is one solution, and equations (4)-(6) is another). Here the value of L1 gives the freedom of selection, which could be adjusted for a proper L2, C1 and Z that the designer expects.

Therefore, it only needs three components (L1, L2, and C1) to form a Doherty combiner which characteristic impedance (Z) could be adjusted by selecting L1's value (see equation (3) and (6). Also, L1 and L2 could be implemented by bond wires while C1 can be an integrated passive device (IPD) capacitor. Using bond wires as inductive elements are very low cost and have a very good quality and high value of self-resonance. Using bond wires and the IPD may have low cost advantage comparing to the Power Amplifier Module (PAM) and integrated Doherty IC.

down-band to 2.3 GHz), by minor modifications to the designs of the output combiner circuit and the input matching networks.

In one embodiment, the output combiner circuit 210 provides a 90 degree phase shift to the signal amplified by the first amplifier 206 so that the signals amplified by the first amplifier 206 and the second amplifier 208 combine in phase at the second amplifier output.

In one or more embodiments, the first power transistor 212 and the second power transistor 218 may have different $$L_2 = \frac{1 - \sqrt{4\omega^4 C_{ds\_c} C_{ds\_p} L_1^2 - 4\omega^2 C_{ds\_p} L_1 + 1}}{2\omega^2 C_{ds\_p}} \tag{1}$$

$$C_1 = \frac{C_{ds\_c}\sqrt{4\omega^4 C_{ds\_c} C_{ds\_p} L_1^2 - 4\omega^2 C_{ds\_p} L_1 + 1} - (C_{ds\_c} + 2\omega^2 C_{ds\_c} C_{ds\_p} L_1 - 2C_{ds\_p})}{(\omega^2 C_{ds\_c} L_1 - 1)\sqrt{4\omega^4 C_{ds\_c} C_{ds\_p} L_1^2 - 4\omega^2 C_{ds\_p} L_1 + 1} - (\omega^2 C_{ds\_c} L_1 - 1)} \tag{2}$$

$$Z = \frac{-\sqrt{4\omega^4 C_{ds\_c} C_{ds\_p} L_1^2 - 4\omega^2 C_{ds\_p} L_1 + 1} - (2\omega^2 C_{ds\_p} L_1 - 2\omega^4 C_{ds\_c} C_{ds\_p} L_1^2 - 1)}{(\omega^3 C_{ds\_c} C_{ds\_p} L_1 - \omega C_{ds\_p})\sqrt{4\omega^4 C_{ds\_c} C_{ds\_p} L_1^2 - 4\omega^2 C_{ds\_p} L_1 + 1} - (\omega^3 C_{ds\_c} C_{ds\_p} L_1 - \omega C_{ds\_p})} \tag{3}$$

$$L_2 = \frac{1 + \sqrt{4\omega^4 C_{ds_c} C_{ds_p} L_1^2 - 4\omega^2 C_{ds_p} L_1 + 1}}{2\omega^2 C_{ds_p}} \tag{4}$$

$$C_1 = \frac{C_{ds_c}\sqrt{4\omega^4 C_{ds_c} C_{ds_p} L_1^2 - 4\omega^2 C_{ds_p} L_1 + 1} + (C_{ds_c} + 2\omega^2 C_{ds_c} C_{ds_p} L_1 - 2C_{ds_p})}{(\omega^2 C_{ds_c} L_1 - 1)\sqrt{4\omega^4 C_{ds_c} C_{ds_p} L_1^2 - 4\omega^2 C_{ds_p} L_1 + 1} + (\omega^2 C_{ds_c} L_1 - 1)} \tag{5}$$

$$Z = \frac{-\sqrt{4\omega^4 C_{ds_c} C_{ds_p} L_1^2 - 4\omega^2 C_{ds_p} L_1 + 1} + (2\omega^2 C_{ds\_p} L_1 - 2\omega^4 C_{ds\_c} C_{ds\_p} L_1^2 - 1)}{(\omega^3 C_{ds\_c} C_{ds\_p} L_1 - \omega C_{ds\_p})\sqrt{4\omega^4 C_{ds\_c} C_{ds\_p} L_1^2 - 4\omega^2 C_{ds\_p} L_1 + 1} + (\omega^3 C_{ds\_c} C_{ds\_p} L_1 - \omega C_{ds\_p})} \tag{6}$$

Thus, the output combiner circuit of this application is actually a C-L-C-L-C architecture. Tuning the proper characteristic impedance of the equivalent quasi quarter-wave transmission line relies on changing L1, L2 and C1. There is no need to add additional shunted capacitor and inductive element at the carrier path side.

The first amplifier 206, the second amplifier 208 and the output combiner circuit 210 may be arranged in a single package. Then the output terminal 204 may have the impedance near the desired value. It's only required to transform the combining node impedance to the system 50 ohm, which may save much PCB room and easy for design as compared with the conventional technologies. On other hand, there is no surface mount (SMT) component inside the package to do input and output matchings, it may also save cost of PCB and SMT components.

Besides, as this application has two input terminals separated and open to access, it may support either of class-AB driver driving Doherty, Doherty driving Doherty or 2-stage Doherty.

In one embodiment, the Doherty amplifier 200 comprises an additional set of bond wires 228. The additional set of bond wires is coupled between the second amplifier output and the output terminal 204, and comprises the output inductive element.

In one embodiment, the first amplifier 206 comprises an input impedance matching network (L4, L5, C2) 234 which is configured to match the impedance between the first input terminal 202a and the first power transistor 212. The second amplifier 208 comprises an input impedance matching network (L6, L7, C3) 236 which is configured to match the impedance between the second input terminal 202b and the power transistor 218. By this way, It may be easy to meet different application requirements (for example, 2.6 GHz size. In this case, the RF amplifier 200 may be an asymmetric Doherty which could provide more flexibility for a designer. In particular, there may be more flexibility in the selection of the inductances L1 and L2 and capacitance C1. Further, particularly in embodiments in which the output of the first or carrier amplifier is not 90° out of phase with that of the second or peaking amplifier, the output combiner circuit 210 may provide a phase shift other than 90 degree (e.g. within a range from 95° to 105°) to the signal amplified by the first amplifier 206 so that the signals amplified by the first amplifier 206 and the second amplifier 208 combine in phase at the second amplifier output. Below is the example of demonstrating the flexibility.

For example, two of the applications in the 5G communication system are 2.6 GHz and 3.5 GHz 64T 320 W projects, which require a 50 W-60 W Doherty final for each channel. Take the 2.5 mm+5.0 mm GaN dies as an example, targeting to the 64T 320 W applications. TABLE 1 lists the iGaN parameters for 2.6 GHz and 3.5 GHz respectively. For the 7.8 dB OBO design, there could be two solutions: one is designed as a symmetric design. And another is the alternative way just proposed in an asymmetric design, in which the impedance of the combining terminal will be the 8.4 ohm in parallel with a 0.825 pF capacitor (Cds_p−Cds_c=1.65−0.825=0.825 pF). For 2.6 GHz, that will be 8.29-0.94j, while it will be 8.21-1.25j for 3.5 GHz. L1 and L2 may have different values to meet the required in-phase combination of carrier and peaking signals at the send amplifier output. And for the asymmetric design, the output combiner circuit 210 may provide a phase shift other than 90 degree (e.g. a degree ranges from 95 to 105) to the signal amplified by the first amplifier 206.

TABLE 1

64 T 320 W iGaN and combiner parameters

| | Carrier | | | Peaking | | | | | | | | | |
|---|---|---|---|---|---|---|---|---|---|---|---|---|---|
| | Die size (mm) | Cds (pF) | Ropt (ohm) | Die size (mm) | Cds (pF) | Ropt (ohm) | Peak Power (dBm) | RL (ohm) | OBO (dB) | L1 (nH) | C1 (pF) | L2 (nH) | Z (ohm) |
| 2.6 GHz | 2.5 | 0.825 | 33.7 | 5.0 | 1.650 | 16.8 | 48.5 | 8.4 | 7.8 | 0.657 | 2.033 | 1.250 | 23.8 |
| | 2.5 | 0.825 | 33.7 | 5.0 | 1.650 | 16.8 | 48.5 | 8.4/C | 7.8 | 1.104 | 2.304 | 1.104 | 23.8 |
| 3.5 GHz | 2.5 | 0.825 | 33.7 | 5.0 | 1.650 | 16.8 | 48.5 | 8.4 | 7.8 | 0.235 | 1.197 | 0.981 | 23.8 |
| | 2.5 | 0.825 | 33.7 | 5.0 | 1.650 | 16.8 | 48.5 | 8.4/C | 7.8 | 0.755 | 1.558 | 0.755 | 23.8 |

Figure 3A:
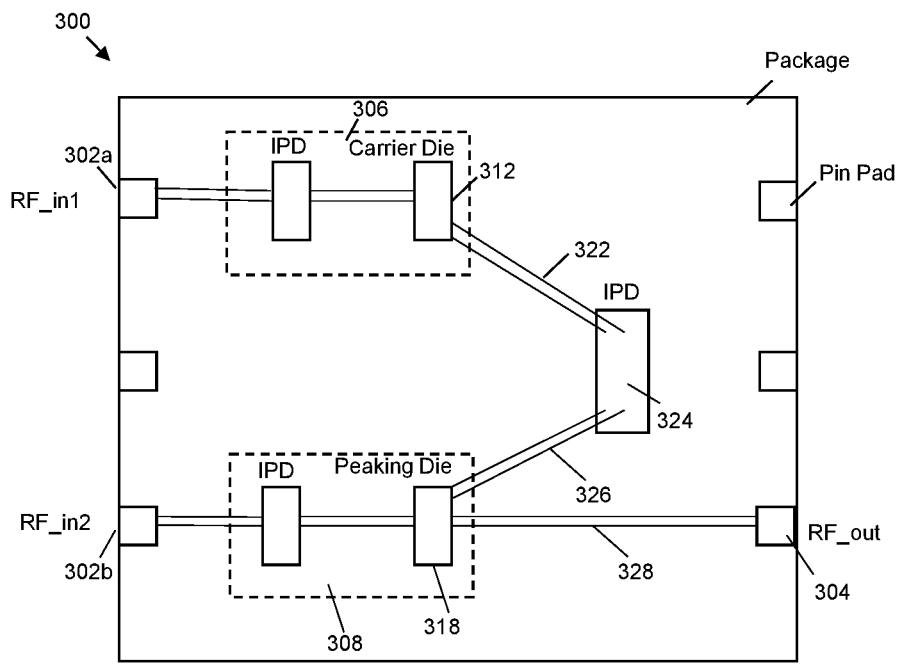
FIG. 3A illustrates simplified schematic diagram of a packaged amplifier device in accordance with an embodiment.
Figure 7:
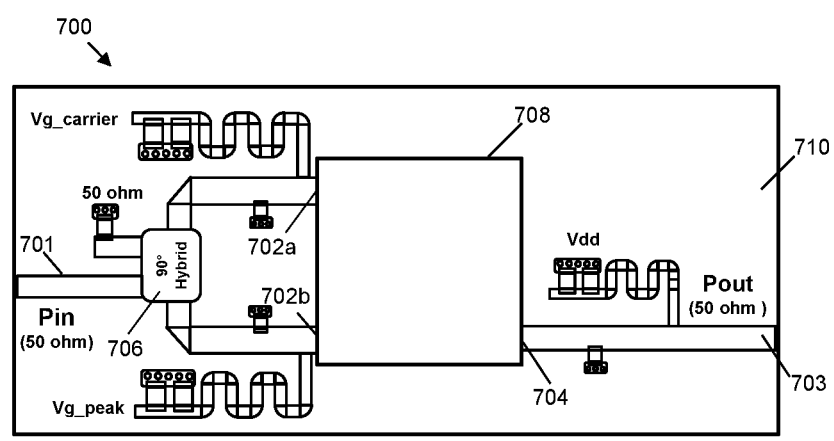
FIG. 7 illustrates a simplified PCB layout sketch of a RF amplifier system in accordance with an embodiment.

FIG. 3A is a simplified schematic diagram of a packaged amplifier device 300 in accordance with an embodiment. The packaged amplifier device 300 (the packaged amplifier device 708 in FIG. 7 of the application) that includes a portion of a RF amplifier system. As shown in FIG. 7, the remainder of the RF amplifier system is implemented on a customer Printed Circuit Board (PCB) to which the packaged amplifier device is connected.

The packaged amplifier device may be a "flat no-leads" device (e.g., a quad-flat no-leads QFN) or dual-flat no-leads (DFN) device). Such a device includes a "lead frame" consisting of a conductive central flange ("exposed thermal paddle") and a plurality of perimeter IO pads or leads (referred to as "pin pads" in the application). The flange and the pads are held in fixed orientation with respect to each other (and electrically isolated from each other) with plastic. The various amplifier dies and the "integrated passive devices" (IPDs) referred to in the application may be all directly attached to the conductive flange, and bond wires may be connected between the top internal surfaces of the pin pads and the dies/IPDs. Plastic molding compound may be then applied over the dies to encapsulate the device. When connected to a PCB, the flange is typically grounded; this provides a ground reference for the encapsulated dies/IPDs. Such a device is typically a surface mount device, so the bottom surfaces of the pin pads are connected (e.g., soldered) to corresponding pads on the top surface of the PCB.

An IPD, as discussed herein, is a, typically small, semiconductor die that includes only "passive" components (e.g., capacitors, resistors, inductive elements), as opposed to an "active" device that is a semiconductor die that includes a transistor. In this application, each IPD may include a bond pad on its top surface to which a bond wire may be connected. The IPD includes an internal capacitor (usually a "metal insulator metal" or MIM capacitor). One terminal of the capacitor is connected to the top bond pad. The other terminal of the capacitor is connected to a conductive layer on the bottom of the IPD. When the IPD is connected (e.g., using solder) to the top surface of the conductive package flange, the second terminal of the capacitor may be grounded.

Referring now to FIG. 3A, this illustrates the physical layout of a packaged amplifier device 300 according to one or more embodiments. The packaged amplifier device 300 comprises a first input lead 302a, a second input lead 302b on pin pads, an output lead 304 on another pin pad, a first amplifier 306, a second amplifier 308, a first inductive element 322, a second inductive element 326 and a capacitor 324.

The first amplifier 306 may include a first transistor 312. The first transistor 312 includes a first transistor input coupled to a first input lead 302a, and a first transistor output. The second amplifier 308 may include a second transistor 318. The second amplifier 308 includes a second transistor input coupled to a second input lead 302b, and a second transistor output coupled to the output lead 304 though inductive element 328.

The first inductive element 322 is coupled between the first transistor output and a first terminal of a capacitor 324, and the second inductive element 326 is coupled between the second transistor output and the first terminal of the capacitor 324, a second terminal of the capacitor 324 is coupled to ground.

In one embodiment, as shown in FIG. 3A, the packaged amplifier device 300 further comprises an integrated passive device (IPD), and the capacitor 324 is formed with the IPD.

Figure 3B:
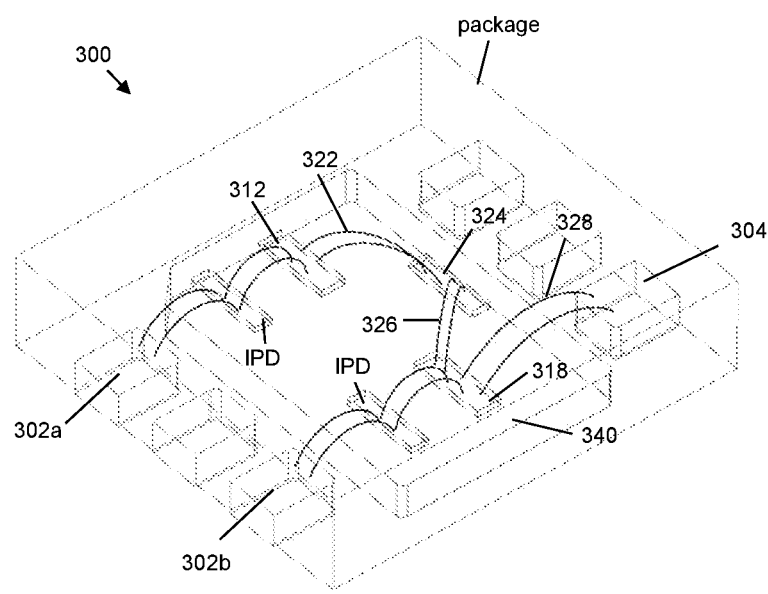
FIG. 3B illustrates a schematic perspective diagram of a packaged amplifier device of FIG. 3A in accordance with an embodiment.

FIG. 3B illustrates a schematic perspective diagram of a packaged amplifier device of FIG. 3A in accordance with an embodiment. In one embodiment, the packaged device is a dual-flat no-leads (DFN) device. All components of the RF amplifier 300 are arranged on a common substrate or flange 340, which may provide a common ground plane for connections to the various grounded capacitances and the source connections of the first and second amplifiers 306, 308. In other embodiments, the packaged device could also be other types device such as quad-flat no-leads (QFN) device.

Figure 4:
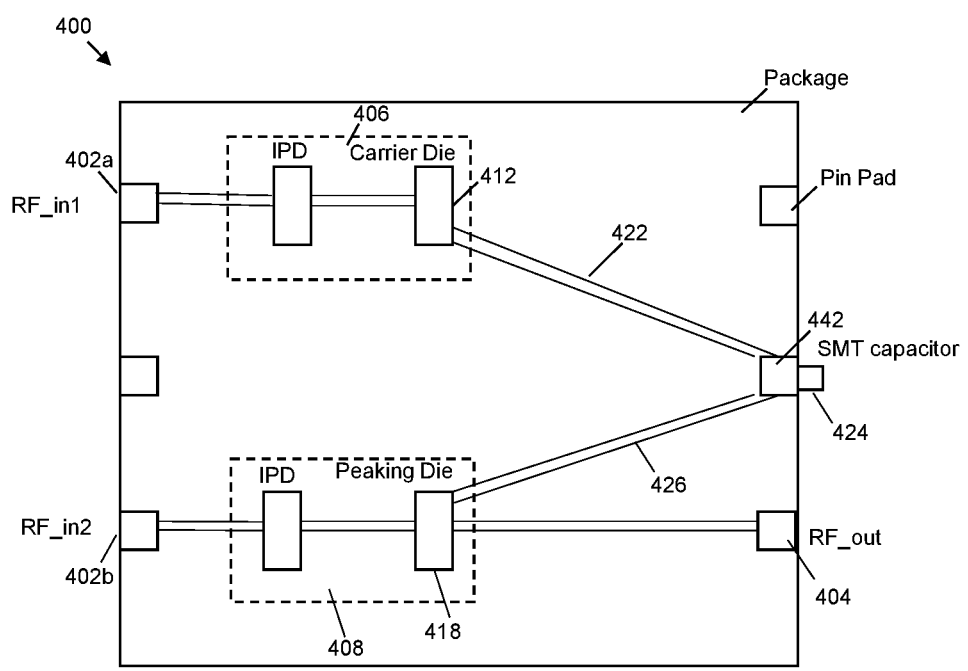
FIG. 4 illustrates simplified schematic diagram of a packaged amplifier device in accordance with an embodiment.

FIG. 4 is a simplified schematic diagram of a packaged amplifier device 400 in accordance with another embodiment. The packaged amplifier device 400 comprises a first input lead 402a, a second input lead 402b on pin pads, an output lead 404 on another pin pad, a first amplifier 406 including a first transistor 412, a second amplifier 408 including a second transistor 418. The difference between FIG. 4 and FIG. 3 is that the capacitor 424 is implemented with a surface mount (SMT) capacitor outside of the packaged amplifier device 400. Each of the first inductive element 422 and the second inductive element 426 may be coupled to a pin pad 442 which is coupled to one terminal of the SMT capacitor 424. The other terminal of the SMT capacitor 424 is grounded, which may be connected to another pad on the top surface of a customer PCB (not shown), which is connected to a ground layer in the PCB through conductive vias. By this way, the SMT capacitor 424 may provide a better Q-factor of the capacitor as compared with the capacitor 324 within the packaged amplifier device.

Figure 5:
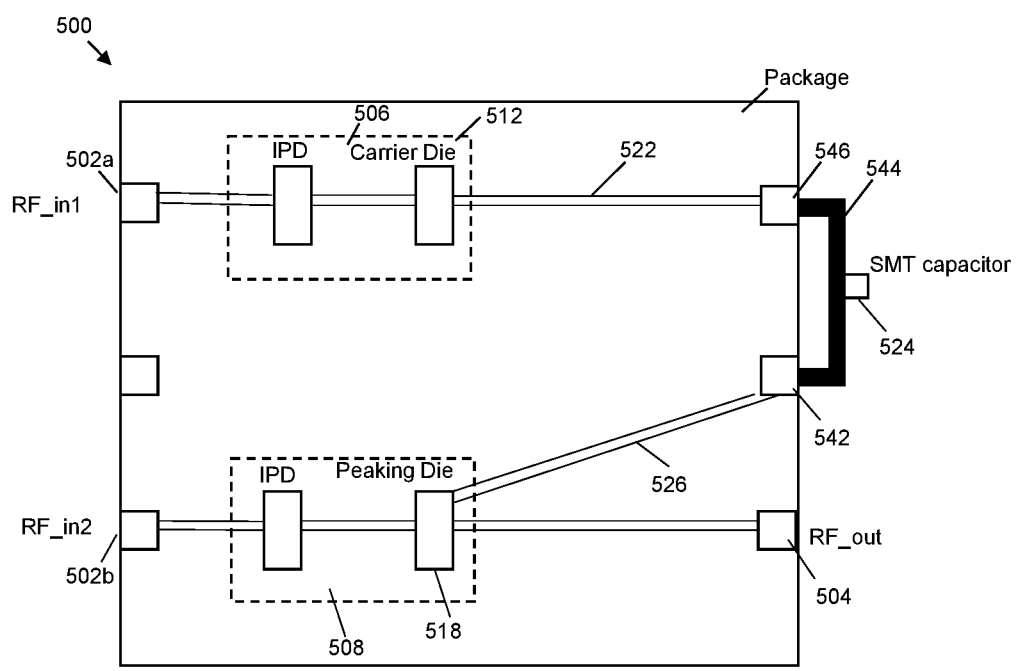
FIG. 5 illustrates a simplified schematic diagram of a packaged amplifier device in accordance with an embodiment.

FIG. 5 is a simplified schematic diagram of a packaged amplifier device 500 in accordance with an embodiment. The packaged amplifier device 500 comprises a first input lead 502a, a second input lead 502b on pin pads, an output lead 504 on another pin pad, a first amplifier 506 including a first transistor 512, a second amplifier 508 including a second transistor 518. The difference between FIG. 5 and FIG. 4 is that the packaged amplifier device 500 further comprises an microstrip line 544 which may be implemented on the top surface of a customer PCB (not shown). The microstrip line is additional to any in the package and may thus be referred as an "additional" microstrip line. The microstrip line 544 is coupled between two pin pads 542, 546. The first inductive element 522 may be coupled to the pin pad 546. The second inductive element 526 may be coupled to the pin pad 542. One terminal of a capacitor 524 is connected to the microstrip line 544. The other terminal of the SMT capacitor 524 is grounded, which may be connected to another pad on the top surface of the customer PCB, which is connected to a ground layer in the PCB through conductive vias. Thus, the microstrip line 544 may provide additional inductance when the bond wires inside the packaged amplifier device 500 cannot provide the required inductance.

Figure 6:
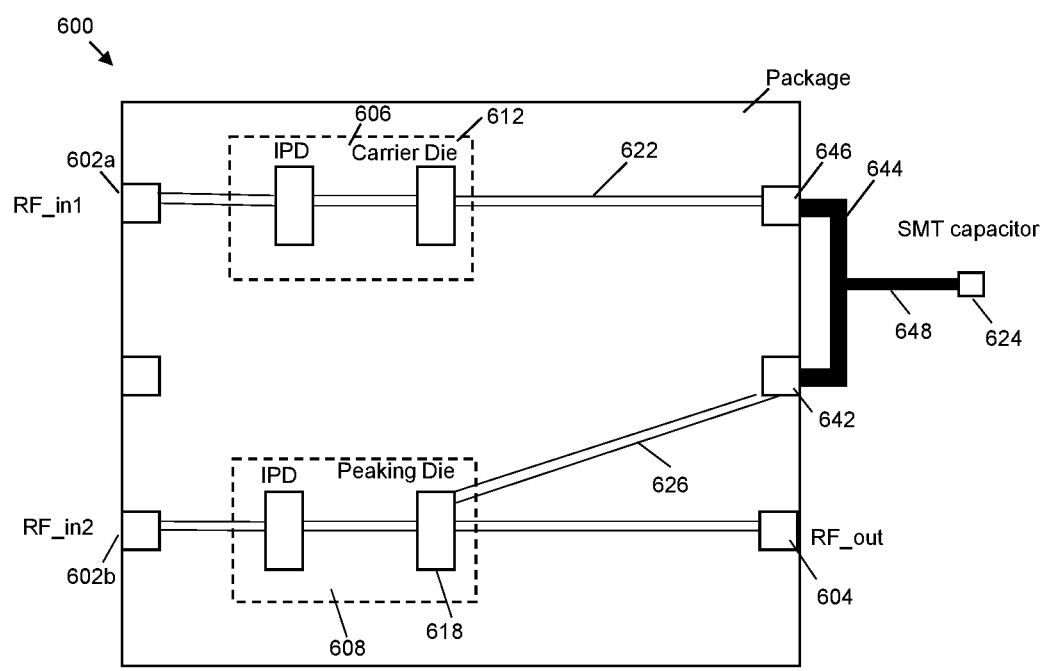
FIG. 6 illustrates a simplified schematic diagram of a packaged amplifier device in accordance with an embodiment.

FIG. 6 is a simplified schematic diagram of a packaged amplifier device 600 in accordance with an embodiment. The packaged amplifier device 600 comprises a first input lead 602a, a second input lead 602b on pin pads, an output lead 604 on another pin pad, a first amplifier 606 including a first transistor 612, a second amplifier 608 including a second transistor 618. The difference between FIG. 6 and FIG. 5 is that the packaged amplifier device 600 further comprises a first microstrip line 644 and a second microstrip line 648. Both the first microstrip line 644 and the second microstrip line 648 may be implemented on the top surface of a customer PCB (not shown). The first microstrip line 644 is coupled between two pin pads 642, 646. The first inductive element 622 may be coupled to the pin pad 646. The second inductive element 626 may be coupled to the pin pad 642. The second microstrip line 648 is coupled to the first microstrip line 644. One terminal of a capacitor 624 is connected to the second microstrip line 648. The other terminal of the SMT capacitor 624 is grounded, which may be connected to another pad on the top surface of the customer PCB, which is connected to a ground layer in the PCB through conductive vias. Thus, the first microstrip line 644 and a second microstrip line 648 may provide additional inductance and make the outside combiner meet the required characteristic impedance of a quasi quarter-wave transmission line.

FIG. 7 is a simplified PCB layout sketch of a RF amplifier system 700. The RF amplifier system 700 comprises an input terminal 701, an output terminal 703, a power splitter 706 and a packaged amplifier device 708. The packaged amplifier device 708 corresponds to the RF amplifier 200 and may be implemented as shown in FIG. 3 to FIG. 6. The remainder of the amplifier system 700 may be implemented on a customer Printed Circuit Board (PCB) 710.

The signal splitter 706 divides an input RF signal supplied at the input terminal 701, and the divided signals are separately fed to a first input terminal 702a and a second input terminal 702b of the packaged amplifier device 708 and then amplified along the carrier and second amplifier paths (not shown) in the packaged amplifier device 708. The output terminal 704 of the packaged amplifier device 708 is connected to the output terminal 703 of the amplifier system 700.

The power splitter 706 may be a little surface mount device connected to the top of the PCB 702. The power splitter 706 may be a "90° Hybrid" device, which would be a small (relative to a packaging amplifier device) surface mount device connected to the top of the PCB. And the "carrier signal" and the "peaking signal" are 90 degrees out of phase from each other at the inputs to the carrier and peaking transistors. In this case, the "90° Hybrid" device applies a 90° phase shift to the peaking signal. The splitter 706 is not limited to "Hybrid" splitter. It also can be other types, such as a Wilkinson splitter. The power splitter 706 may also be implemented in the packaged amplifier device 708.

FIG. 7 only shows one example of a RF amplifier system. The RF amplifier system may have different architecture such as the first input terminal 702a and second input terminal 702b connected to one or two output terminals of a driver which maybe a class AB driver, a Doherty driver or a dual-path driver.

Figure 8:
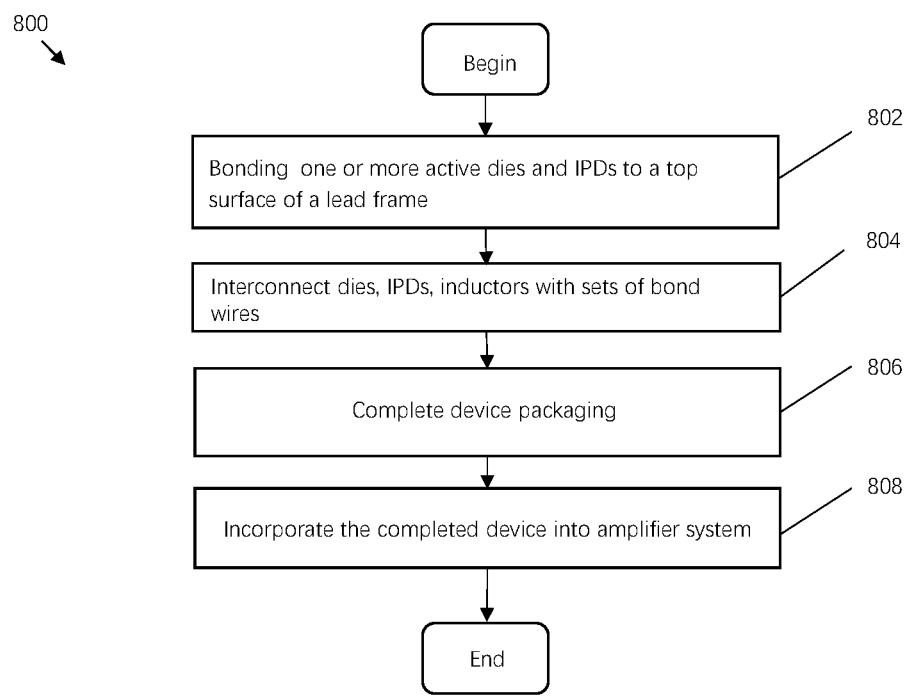
FIG. 8 illustrates a flowchart of a method of fabricating a RF amplifier in accordance with an example combination.

FIG. 8 is a flowchart of a method of fabricating a RF amplifier system in accordance with an example combination. In block 802, fabricating a packaged RF amplifier device may include bonding one or more active dies and other components (e.g., IPDs) to a top surface of a lead frame. In block 804, fabricating a packaged RF amplifier device may further include interconnect dies, IPDs, inductive elements in the form of sets of bond wires, between the input leads or pin pads, the active dies, the IPDs, the other components, and the output leads or pin pads. Connection of the bond wires essentially completes the formation of the amplifier paths, including the input and output impedance matching circuit. After attachment of the bond wires, packaging of the part of the RF amplifier may be completed in block 806. For example, in block 806, the active dies, IPDs, other components, bond wires, portions of the input and output leads, and at least part of the top surface of the lead frame are encapsulated with a non-conductive molding compound. Then in block 808, the completed device may be incorporated into an amplifier system which includes mounting the device on a PCB (or other substrate) so that the device substrate is electrically connected to the system's ground voltage reference.

Thus, viewed from one perspective, the present disclosure provides a RF amplifier and a packaged amplifier device. The RF amplifier and a packaged amplifier device may be considered to have a C-L-C-L-C architecture output combiner circuit integrated into a dual-path discrete part. Besides, the output combiner circuit comprises bond wires, and may include an IPD inside the package. Either or both the RF amplifier and the packaged amplifier device may have one or more advantages such as size reduction, low cost, PCB design friendliness, application flexibility and short go-to-market time, compared with known devices.

Although the operations of the method herein are shown and described in a particular order, the order of the operations of the method may be altered so that certain operations may be performed in an inverse order or so that certain operations may be performed, at least in part, concurrently with other operations.

Referring now to the use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the application as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

The invention claimed is:

1. A radio frequency amplifier comprising:
   a first input terminal coupled to a first input lead in a semiconductor package;
   a second input terminal coupled to a second input lead in the semiconductor package and isolated from the first input terminal, wherein the first input lead is electrically isolated from the second input lead;
   an output terminal coupled to an output lead in the semiconductor package;
   a first amplifier including a first amplifier input coupled to the first input terminal, and a first amplifier output;
   a second amplifier including a second amplifier input coupled to the second input terminal, and a second amplifier output coupled to the output terminal by an output inductive element, wherein the first amplifier input is electrically isolated from the second amplifier input; and
   an output combiner circuit coupled between the first amplifier output and the second amplifier output, wherein the output combiner circuit comprises a first inductive element, a capacitor and a second inductive element, wherein the first inductive element is coupled between the first amplifier output and a first terminal of the capacitor, the second inductive element is coupled between the second amplifier output and the first terminal of the capacitor, and a second terminal of the capacitor is coupled to ground.

2. The radio frequency amplifier of claim 1, wherein the output combiner circuit provides a phase shift other than 90 degree to signals amplified by the first amplifier so that the signals amplified by the first amplifier and the second amplifier combine in phase at the second amplifier output.

3. A radio frequency amplifier comprising:
   a semiconductor package including an output lead, a first input lead, a second input lead that is electrically isolated from the first input lead, the semiconductor package encasing:
      a first amplifier comprising a first transistor, wherein the first transistor includes a first transistor input coupled to the first input lead, and a first transistor output;
      a second amplifier comprising a second transistor, wherein the second transistor includes a second transistor input coupled to the second input lead, and a second transistor output coupled to the output lead, wherein the second transistor input is electrically isolated from the first transistor input; and
      a first inductive element and a second inductive element, wherein the first inductive element is coupled between the first transistor output and a first terminal of a capacitor, and the second inductive element is coupled between the second transistor output and the first terminal of the capacitor, wherein a second terminal of the capacitor is coupled to ground.

4. The radio frequency amplifier of claim 3, wherein the semiconductor package further comprises an integrated passive device (IPD) in the semiconductor package, wherein the capacitor is formed with the IPD.

5. The radio frequency amplifier of claim 3, wherein the capacitor is a surface mount capacitor outside of the semiconductor package.

6. A radio frequency amplifier comprising:
   a semiconductor package including an output lead, a first input lead, a second input lead, the semiconductor package encasing:
      a first amplifier comprising a first transistor, wherein the first transistor includes a first transistor input coupled to the first input lead, and a first transistor output;
      a second amplifier comprising a second transistor, wherein the first transistor includes a second transistor input coupled to the second input lead, and a second transistor output coupled to the output lead;
      a first inductive element and a second inductive element, wherein the first inductive element is coupled between the first transistor output and a first terminal of a capacitor, and the second inductive element is coupled between the second transistor output and the first terminal of the capacitor, wherein a second terminal of the capacitor is coupled to ground; and
   a first microstrip line outside of the semiconductor package and coupled between the first inductive element and the second inductive element, wherein the first microstrip line is coupled to the capacitor, and wherein the capacitor is a surface mount capacitor outside of the semiconductor package.

7. The radio frequency amplifier of claim 6, further comprising a shunt microstrip line outside of the semiconductor package coupled between the first microstrip line and the capacitor.

8. The radio frequency amplifier of claim 3, wherein the first inductive element, the second inductive element and the capacitor together provide a 90-degree phase shift to signals amplified by the first amplifier so that signals amplified by the first amplifier and the second amplifier combine in phase at the second transistor output.

9. The radio frequency amplifier of claim 3, wherein the first inductive element, the second inductive element and the capacitor together provide a phase shift other than 90 degree to signals amplified by the first amplifier so that the signals amplified by the first amplifier and the second amplifier combine in phase at the second transistor output.

10. A packaged amplifier device comprising:
    a first input lead and a second input lead that is electrically isolated from the first input lead coupled to a package;
    an output lead coupled to the package;
    a first amplifier with a first transistor, wherein the first transistor includes a first transistor input coupled to the first input lead, and a first transistor output;

a second amplifier with a second transistor, wherein the second transistor includes a second transistor input coupled to the second input lead, and a second transistor output coupled to the output lead, wherein the second transistor input is electrically isolated from the first transistor input; and a first inductive element and a second inductive element, wherein the first inductive element is coupled between the first transistor output and a first terminal of a capacitor, the second inductive element is coupled between the second transistor output and the first terminal of the capacitor, and a second terminal of the capacitor is coupled to ground.

11. The radio frequency amplifier of claim 1, wherein the first inductive element comprises a set of bond wires coupled between the first amplifier output and the first terminal of the capacitor, and the second inductive element comprised another set of bond wires coupled between the second amplifier output and the first terminal of the capacitor.

12. The radio frequency amplifier of claim 1, further comprising an additional set of bond wires, wherein the additional set of bond wires is coupled between the second amplifier output and the output terminal of the radio frequency amplifier.

13. The radio frequency amplifier of claim 1, wherein the first amplifier comprises a first input impedance matching network and a first power transistor, wherein the first input impedance matching network is configured to match an impedance between the first amplifier input and the first power transistor; and the second amplifier comprises a second input impedance matching network and a second power transistor, wherein the second input impedance matching network is configured to match the impedance between second amplifier input and the second power transistor.

14. The radio frequency amplifier of claim 13, wherein the first power transistor is a field effect transistor with a gate terminal coupled to the first input impedance matching network, a drain terminal coupled to the first inductive element and a source terminal coupled to ground.

15. The radio frequency amplifier of claim 1, wherein the output combiner circuit provides a 90 degree phase shift to signals amplified by the first amplifier so that the signals amplified by the first amplifier and the second amplifier combine in phase at the output of the second amplifier.

16. The radio frequency amplifier of claim 3, further comprising a set of bond wires, wherein the set of bond wires is coupled between the second transistor output and the output lead.

17. The packaged amplifier device of claim 10, further comprises an integrated passive device (IPD), wherein the capacitor is formed with the IPD.

18. The packaged amplifier device of claim 10, wherein the capacitor is a surface mount capacitor outside of the package.

19. The packaged amplifier device of claim 10, wherein the first inductive element, the second inductive element and the capacitor together provide a 90 degree phase shift to signals amplified by the first amplifier so that the signals amplified by the first amplifier and the second amplifier combine in phase at the second transistor output.

20. The packaged amplifier device of claim 10, wherein the first inductive element, the second inductive element and the capacitor together provide a phase shift other than 90 degree to signals amplified by the first amplifier so that the signals amplified by the first amplifier and the second amplifier combine in phase at the second transistor output.

* * * * *